US010075158B2

(12) United States Patent
Bayerer et al.

(10) Patent No.: US 10,075,158 B2
(45) Date of Patent: Sep. 11, 2018

(54) METHOD AND DRIVE CIRCUIT FOR DRIVING A TRANSISTOR

(71) Applicant: Infineon Technologies AG, Neubiberg (DE)

(72) Inventors: Reinhold Bayerer, Reichelsheim (DE); Johannes Georg Laven, Taufkirchen (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/248,906

(22) Filed: Aug. 26, 2016

(65) Prior Publication Data

US 2017/0063365 A1    Mar. 2, 2017

(30) Foreign Application Priority Data

Aug. 27, 2015   (DE) .................... 10 2015 114 284

(51) Int. Cl.
*H03K 17/00* (2006.01)
*H03K 17/16* (2006.01)
*H03K 17/0812* (2006.01)

(52) U.S. Cl.
CPC ..... *H03K 17/168* (2013.01); *H03K 17/08128* (2013.01); *H03K 17/162* (2013.01)

(58) Field of Classification Search
CPC ........... H03K 17/168; H03K 17/08128; H03K 17/162
USPC ........................................................ 327/109
See application file for complete search history.

(56) References Cited

U.S. PATENT DOCUMENTS

| 4,926,283 | A | 5/1990 | Qualich | |
| 8,633,755 | B2* | 1/2014 | Kawamoto | .......... H03K 17/163 327/309 |
| 9,093,836 | B2* | 7/2015 | Reiter | ................ H03K 17/0828 |
| 2011/0002073 | A1* | 1/2011 | Fukuda | .................... H03F 1/523 361/87 |
| 2014/0049866 | A1* | 2/2014 | Reiter | ............... H03K 17/0828 361/86 |

FOREIGN PATENT DOCUMENTS

DE    102011003733 A1    8/2012

* cited by examiner

*Primary Examiner* — Ryan Jager
(74) *Attorney, Agent, or Firm* — Murphy, Bilak & Homiller, PLLC

(57) ABSTRACT

A transistor is driven by a drive circuit that includes a logic unit and drive signal generator. The drive signal generator outputs a temporally variable drive voltage for driving the transistor, based on setpoint state information. A short-circuit information signal contains information about a possible short circuit of a load connected in series with the transistor load path. In response to this signal, the drive signal generator switches on the transistor at a first point in time by setting the transistor drive voltage to a value or a value range above a switch-on threshold value of the transistor, but limits the drive voltage to a maximum first switch-on voltage limit value. The drive signal generator maintains the drive voltage at maximally the first switch-on voltage limit value or sets the drive voltage to a value or a value range greater than or equal to a second switch-on voltage limit value.

19 Claims, 7 Drawing Sheets

METHOD AND DRIVE CIRCUIT FOR DRIVING A TRANSISTOR

PRIORITY CLAIM

This application claims priority to German Patent Application No. 10 2015 114 284.8 filed on 27 Aug. 2015, the content of said application incorporated herein by reference in its entirety.

TECHNICAL FIELD

The present invention relates to a method for driving a transistor, and to a drive circuit for a transistor. In this case, the transistor can be used in particular for switching an electrical load.

BACKGROUND

The use of transistors as electronic switches is widespread. Owing to the high switching frequencies with which transistors can be operated, transistors are not only suitable as "static" switches that are closed over a relatively long period of time, such as a few seconds, minutes or hours, but are also suitable for the clocked or pulsed driving of loads.

Transistors driven in a clocked or pulsed manner are used for example in driver circuits for inductive loads, such as, for example, in half-bridge or full-bridge drivers for electric motors, solenoid valves, etc. A further field of use is switching converters or switch mode power supplies, in which a clocked driving of a transistor serves for regulating the current consumption and thus for regulating the output voltage. However, the present invention is not restricted to these applications.

For driving the transistor, usually by means of a logic unit a digital control signal is output and fed to a drive signal generator, which generates a drive voltage for the transistor depending on the digital control signal. The digital control signal specifies whether the transistor is intended to be switched on or to remain switched on, or whether it is intended to be switched off or to remain switched off. By way of example, a high level of the digital control signal may mean that the transistor is intended to be switched on, and a low level that the transistor is intended to be switched off.

If a transistor such as, for example, an IGBT or a MOSFET is switched on in normal operation, its load current I (i.e. the current through the load path between emitter and collector or between source and drain) is limited by the operating voltage $V_B$, and the load amount (more precisely: the resistance $R_L$ thereof). The minimum voltage across the load path in the fully switched-on state of the transistor is also referred to as the forward or saturation voltage $V_{CE,SAT}$. For the power loss $P_V$ dissipated in the transistor in normal operation it holds true that: $P_V = I \cdot V_{CE,SAT}$. In the switched-on state, for a given gate voltage $V_{GE}$ (i.e. in an IGBT the voltage between gate and emitter or in a MOSFET the voltage between gate and source), the transistor can carry a specific maximum load current I, which is also referred to as saturation current $I_{SAT}$. The saturation current $I_{SAT}$ is thus dependent on the gate voltage $V_{GE}$ chosen.

Since, in the case of a short circuit, the full operating voltage $V_B$ is dropped across the load path of the transistor ($V_{CE} = V_B$), the load current I normally rises up to the saturation current $I_{SAT}$. For the power loss $P_{MAX}$ during short-circuit operation, i.e. if a short circuit of a load connected in series with the load path is present, it holds true that: $P_{MAX} = V_B \cdot I_{SAT}$. For the energy $E_{MAX}$ dissipated in short-circuit operation it holds true that: $E_{MAX} = V_B \cdot I_{SAT} \cdot t_{SC}$, wherein $t_{SC}$ denotes the time between the occurrence of the short circuit of the load and the switching off of the transistor. In order to prevent a thermal runaway of the transistor, the energy $E_{MAX}$ should remain below a critical energy $E_{CRIT}$, since the transistor is otherwise destroyed on account of a very high hot leakage current as a result of thermal runaway.

The operating voltage $V_B$ is usually predefined by the application. The time $t_{SC}$ required for the detection of a short circuit and the subsequent switching off of the transistor is substantially dependent on external parameters. In principle, it is possible to design a transistor with a high short-circuit strength, such that $t_{SC}$ can be chosen to be relatively long. However, this is associated with a low saturation current $I_{SAT}$ and a high forward voltage, which results in higher losses in normal operation. Therefore, there is a conflict of aims between a good performance in normal operation, on the one hand, and the required short-circuit strength, on the other hand.

The saturation current $I_{SAT}$ and also the saturation voltage $V_{CE,SAT}$ of a transistor such as an IGBTs or MOSFETs are dependent, as already mentioned, on the gate voltage $V_{GE}$ present at the gate terminal of the transistor. If the gate voltage is only slightly greater than a switch-on threshold voltage Vth of the transistor, the saturation current $I_{SAT}$ is comparatively small and the saturation voltage $V_{CE,SAT}$ is comparatively large. The higher the gate voltage $V_{GE}$ applied to the gate terminal, the higher the saturation current $I_{SAT}$ becomes and the lower the saturation voltage $V_{CE,SAT}$ and the losses in normal operation are. The relationship between saturation voltage $V_{CE,\ SAT}$ and gate voltage $V_{GE}$ is nonlinear. Starting from a specific level of the gate voltage $V_{GE}$ a further increase no longer leads to a significant reduction of the saturation voltage $V_{CE,SAT}$.

In order to detect a short circuit of a load it is known, in principle, to monitor by means of a short-circuit monitoring a measurement variable which allows the conclusion to be drawn about the occurrence of a short circuit of the load, and, if the monitoring of the measurement variable is indicative of the presence of a short circuit, to drive the transistor in the off state and thereby to switch it off (protective switch-off). However, in specific situations it happens that the short-circuit monitoring incorrectly signals a short circuit of the load, without a short circuit of the load actually being present. In these cases, the transistor would be switched off unnecessarily.

By way of example, the short-circuit monitoring can use the current through the load path of the transistor as a measurement variable. If capacitances electrically connected to the transistor, e.g. capacitors or parasitic capacitances such as electrical terminal and connection lines, are then charged or subjected to charge reversal on account of the transistor being switched on, it may be that the current through the load path of the transistor temporarily rises to values that are higher than the maximum permissible continuous current through the transistor. Therefore, in order to avoid destruction of the transistor, the short-circuit monitoring outputs to the logic unit a signal which causes the transistor to be switched off in an unscheduled manner. In order to avoid such an unscheduled switching off (i.e. caused by a wrongly indicated short circuit of the load) of the transistor and to enable proper switching operation of the transistor, an unscheduled switching off of the transistor must be prevented for a certain waiting duration (typically:

10 μs) starting from the switching on of the transistor until, after the switching on, it can be unambiguously established whether a short circuit of the load is actually present. For the case where a short circuit of the load is already present when the transistor is switched on, and the short-circuit monitoring correctly decides on the presence of a short circuit of the load, the transistor must be able to withstand the waiting duration in the switched-on state (i.e. when its load path is conducting) without being damaged. In principle, transistors having a lower efficiency (i.e. transistors having higher on-state losses) could be used for this purpose, although this leads to undesired losses in normal operation. Therefore, the practice has been adopted of driving the transistor with a reduced drive voltage for a predefined waiting duration upon switch-on and increasing the drive voltage after the waiting duration has elapsed, provided that the short-circuit monitoring does not signal a short circuit once the waiting duration has elapsed. The predefined waiting duration and the reduced drive voltage are coordinated with one another such that the transistor is not damaged even if the load is short-circuited during the entire waiting duration. Since drive circuits of a specific type are usually operated in conjunction with a wide variety of hardware configurations, the capacitances are not fixed from the outset. Therefore, the waiting time must contain a sufficient safety margin. However, this has the effect that the transistor is driven with the reduced drive voltage during the waiting time even if the short-circuit monitoring does not signal a short circuit. This in turn results in operation with reduced efficiency.

SUMMARY

Embodiments described herein provide a method for driving a transistor which can be operated with a high efficiency and in which the risk of damage to the transistor in the case of a short circuit of a load connected to the transistor is nevertheless reduced. A corresponding drive circuit for driving a transistor connected to a load is also provided.

According to an embodiment, a method is provided for driving a transistor comprising a drive terminal and a load path. The driving is effected by means of a drive circuit comprising a logic unit and a drive signal generator. The drive signal generator is designed to output a temporally variable drive voltage with which the transistor is driven. The drive signal generator receives from the logic unit setpoint state information according to which the transistor is intended in principle to be switched on or to remain switched on or according to which the transistor is intended in principle to be switched off or to remain switched off. A first short-circuit information signal of a short-circuit monitoring unit is fed to the drive signal generator, said signal containing information about the potential presence of a short circuit of an electrical load connected in series with the load path. As a reaction to setpoint state information, the drive signal generator switches on the transistor at a first point in time by virtue of the fact that it sets the drive voltage to a value or a value range above a switch-on threshold value of the transistor but limits the drive voltage to a maximum first switch-on voltage limit value. Depending on the first short-circuit information signal, the drive signal generator decides whether it maintains the limiting of the drive voltage to maximally the first switch-on voltage limit value or whether it sets the drive voltage of the transistor to a value or a value range greater than or equal to a second switch-on voltage limit value, which is greater than the first switch-on voltage limit value.

According to an embodiment, a drive circuit for driving a transistor comprising a drive terminal and a load path is provided. The driving is effected by means of a drive circuit comprising a logic unit and a drive signal generator. The drive signal generator is designed to output a temporally variable drive voltage for driving a transistor. The logic unit is designed to output setpoint state information according to which the transistor is intended in principle to be switched on or to remain switched on or according to which the transistor is intended in principle to be switched off or to remain switched off. The drive circuit is designed to feed the setpoint state information to the drive signal generator. The drive signal generator comprises an input via which a first short-circuit information signal can be fed to it. The drive signal generator is furthermore designed to switch on the transistor, as a reaction to setpoint state information, at a first point in time by virtue of the fact that it sets the drive voltage to a value or a value range above a switch-on threshold value of the transistor but limits it to a maximum first switch-on voltage limit value. The drive signal generator is further designed to receive a first short-circuit information signal and, depending on the first short-circuit information signal, to decide whether it maintains the limiting of the drive voltage to maximally the first switch-on voltage limit value or whether it sets the drive voltage to a value or a value range greater than or equal to a second switch-on voltage limit value, which is greater than the first switch-on voltage limit value.

The drive circuit may be designed in particular to carry out the method for driving a transistor comprising a drive terminal and a load path.

Those skilled in the art will recognize additional features and advantages upon reading the following detailed description, and upon viewing the accompanying drawings.

BRIEF DESCRIPTION OF THE DRAWINGS

Exemplary embodiments of the invention are explained in greater detail below with reference to drawings. The drawings serve for elucidating the basic principle, and so only the features necessary for understanding the basic principle are illustrated. In the drawings, identical reference signs designate identical features having the same meaning.

FIG. 3 illustrates the temporal profile of various signals of an arrangement in accordance with FIG. 1, wherein, in accordance with a short-circuit event of a first type, a short circuit of the load is already present when the transistor is switched on.

FIG. 4 illustrates the temporal profile of various signals of an arrangement in accordance with FIG. 1, wherein, in accordance with a short-circuit event of a second type, a short circuit of the load occurs only after the transistor has been switched on.

FIG. 7 illustrates a first example of a possible temporal profile of the drive voltage output by the drive signal generator upon switch-on.

FIG. 8 illustrates a second example of a possible temporal profile of the drive voltage output by the drive signal generator upon switch-on.

DETAILED DESCRIPTION

Figure 1:
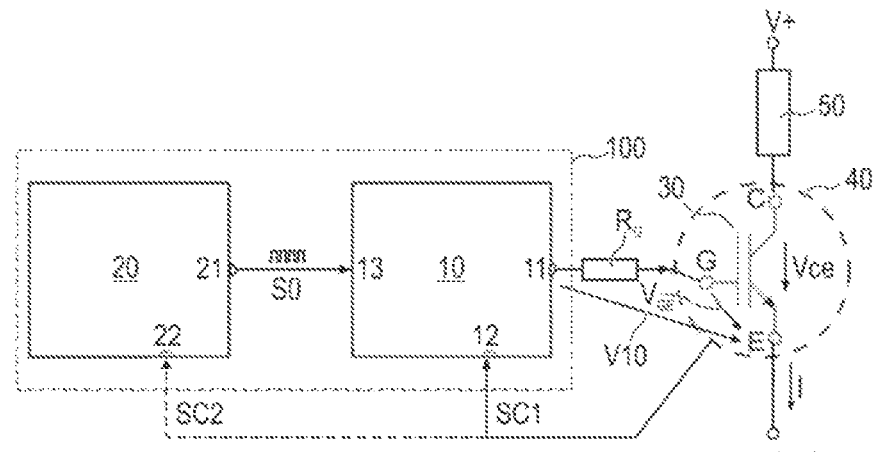
FIG. 1 schematically illustrates a circuit comprising a drive circuit that drives a transistor, a load being connected in series with the load path of said transistor.

FIG. 1 schematically shows a circuit arrangement comprising a transistor 30, a drive circuit 100 for driving the transistor 30, and also a load 50 and a short-circuit monitoring unit 40. The transistor 30 comprises a load path C-E, and also a control terminal G, by means of which a current through the load path C-E can be controlled. The load 50 is connected in series with the load path C-E between terminals for a respective supply potential (here merely by way of example for a positive supply potential V+ and for a negative supply potential or reference potential GND). Generally, the supply potential can be chosen arbitrarily, for example the difference V+ minus V− can always be positive, or it can always be positive and additionally constant, but it can also change its sign over the course of time, which is the case for example if the transistor together with another switch forms a half-bridge, wherein the load is connected to the circuit node of the half-bridge.

The drive circuit 100 serving for driving the transistor 30 comprises a logic unit 20, and also a drive signal generator 10, which is connected downstream of the logic unit 20. The logic unit 20 comprises an output 21, at which it outputs a signal S0 containing setpoint state information according to which the transistor 30 is intended to be switched on or to remain switched on or according to which the transistor 30 is intended to be switched off or to remain switched off. The transistor 30 is switched on in this sense if its load path C-E (at a low forward voltage), is in a low-resistance, electrically conducting state, and the transistor is switched off if its load path C-E is in a high-resistance, electrically locking state.

The signal S0, containing the setpoint state information and provided by the logic unit 20 at its output 21 is fed to an input 13 of the drive signal generator 10. In principle, the signal S0 can be transmitted via a galvanic connection between the output 21 and the input 13. Alternatively, however, there is also the possibility of the output 21 and the input 13 being decoupled galvanically or by semiconductors that take up voltage, for example by means of a transformer, an optocoupler or any other signal transmission device that effects galvanic isolation or takes up voltage. If the transmission of the signal S0 from the output 23 to the input 13 is effected in a galvanically isolated way, and provided that a second short-circuit information signal SC2 is furthermore output to the logic unit 20, the transmission of the second short-circuit information signal SC2 from the short-circuit determining unit 40 to the input 22 of the logic unit 20 is also effected via a galvanically isolated signal transmission, for example by means of a transformer, an optocoupler or any other signal transmission device that effects galvanic isolation or takes up voltage.

The signal S0 can be for example a purely digital signal which (apart from unavoidable overshooting at the switching edges) assumes only exactly two different states: a first setpoint state (e.g. a first level, e.g. a high level or a low level), which states that the transistor 30 is intended to be switched on or to remain switched on, and a second setpoint state (e.g. an (e.g. complementary) second level different than the first level, e.g. a low level or a high level), which is different than the first setpoint state and states that the transistor 30 is intended to be switched off or to remain switched off.

Provided that the first setpoint state and the second setpoint state (relative to a common reference potential, e.g. GND) are output in each case as a voltage level, the difference between the voltage level corresponding to the first setpoint state and the voltage level corresponding to the second setpoint state may be for example less than or equal to 5 V.

By way of example, the signal S0 can be a pulse-width-modulated signal (PWM signal). The PWM signal can have a constant frequency across a predefined period of time, for example a frequency in the range of 100 Hz to 40 kHz, in particular of 1 kHz to 15 kHz, or, within a predefined period of time, switchably assume two or more frequencies which are different in pairs and each of which is in the range of 100 Hz to 40 kHz, in particular of 1 kHz to 15 kHz. In principle, however, not just PWM signals but any other, in particular digital, signals are suitable for the signal S0. The signal S0 can have a predefined frequency, although this need not necessarily be the case.

The logic unit 20 can be embodied using an arbitrary technology, in principle; by way of example, it can contain a microprocessor or be embodied as such.

A short-circuit monitoring unit 40, which is merely illustrated schematically, monitors at least one measurable variable of the circuit and deduces from the at least one measured variable whether a potential short circuit of the load 50 is present. The short-circuit monitoring unit 40 outputs a first short-circuit information signal SC1, which is fed to an input 12 of the drive signal generator 10, and optionally a second short-circuit information signal SC2, which is fed to an input 22 of the logic unit 20. As illustrated, the drive signal generator 10 receives the first short-circuit information signal SC1 not via the logic unit 20, in particular not via the signal S0 or not via the signal path from the output 21 to the input 13. From the first short-circuit information signal SC1 and, if present, the second short-circuit information signal SC2, it can be inferred in each case whether or not a potential short circuit of the load 50 is present. The way in which the short-circuit monitoring unit 40 determines the presence of a potential short circuit of the load 50 is arbitrary in principle. Examples thereof will be explained later.

In the case of the circuit in accordance with FIG. 1, the optional second short-circuit information signal SC2 is fed directly to the logic unit 20. However, there is also the possibility of using the first short-circuit information signal SC1 fed to the drive signal generator 10 as a basis for the second short-circuit information signal SC2 and feeding said first short-circuit information signal (changed or unchanged) as second short-circuit information signal SC2 to the logic unit 20. By way of example, a bidirectional signal transmission can be provided between the output 21 and the input 13 for this purpose, the signal S0 also being transmitted via said bidirectional signal transmission.

Depending on the signal S0 and/or the first short-circuit information signal SC1, the drive signal generator 10 provides at an output 11 an output potential which is fed to a control terminal G (here a gate terminal G) of the transistor 30 directly or via an optional gate resistor $R_G$ connected upstream of the gate of the transistor. Provided that such a gate resistor $R_G$ is present, it can also be integrated into the transistor 30, or can be connected in series with a further gate resistor integrated into the transistor 30. A voltage V10 between the output potential at the output 11 and a reference potential (here the potential of an emitter terminal E of the transistor 30) for driving the control terminal G and thus the transistor 30 is also referred to hereinafter as "drive voltage", that is to say as voltage output by the drive signal generator 10. The reference potential can, but need not necessarily, constitute a potential of a terminal of the transistor 30; by way of example, GND (ground) or some other potential can also be used as reference potential. The drive voltage V10 is temporally variable, such that the transistor 30 can be switched on or switched off by a suitable choice of the drive voltage V10.

The drive voltage V10 should be differentiated from the gate voltage $V_{GE}$ of the transistor 30, i.e. the voltage $V_{GE}$ between the gate terminal and the emitter terminal of the transistor 30 in the case of an IGBT or the voltage $V_{GS}$ between the gate terminal and the source terminal of the transistor 30 in the case of a MOSFET. Since an IGBT is used for the transistor 30 in the example in accordance with FIG. 1, only the designation $V_{GE}$ is used hereinafter. However, all explanations in this regard apply equally to the gate voltage $V_{GS}$ of a transistor embodied as a MOSFET.

If the drive voltage V10 is chosen to be less than a switch-on threshold voltage Vth of the gate voltage $V_{GE}$, upon the exceedance of which the transistor 30 switches on, then the transistor 30 is switched off, i.e. its load path C-E or, to put it another way, the transistor 30 effects blocking, which is tantamount to the transistor being switched off. This is symbolized by the indication Voff in the following diagrams. Voff can be a constant voltage that is less than the switch-on threshold voltage Vth, or Voff can represent a voltage range or a constant value below the switch-on threshold voltage Vth, i.e. every value of the voltage range is less than the switch-on threshold voltage Vth. Voff can in particular also be constant, for example equal to 0 V, or greater than 0 V, and in this case less than the switch-on threshold value Vth, or less than 0 V. If, on the other hand, the drive voltage V10 is chosen to be greater than the switch-on threshold voltage Vth, then the transistor 30 is switched on, i.e. its load path C-E or, to put it another way, the transistor 30 is conducting, which is tantamount to the transistor 30 being switched on. With the transistor 30 switched on, the electrical resistance of the load path C-E is all the lower, the higher the gate voltage $V_{GE}$ of said transistor, i.e. the higher the drive voltage V10 is chosen to be. The current to which the transistor 30 limits itself is equal to zero if the gate voltage $V_{GE}$ is below the switch-on threshold voltage Vth, and the current increases with increasing gate voltage $V_{GE}$, as soon as the gate voltage $V_{GE}$ exceeds the switch-on threshold voltage Vth.

Figure 2:
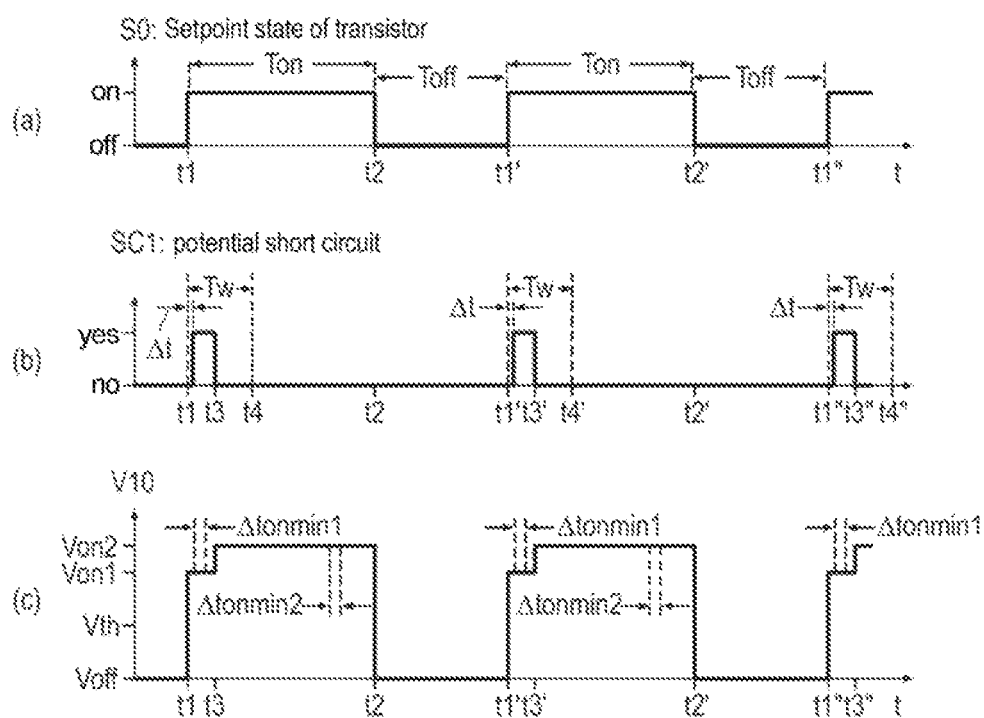
FIG. 2 illustrates the temporal profile of various signals of an arrangement in accordance with FIG. 1, wherein no short circuit of the load occurs.

The switching of the arrangement in accordance with FIG. 1 can take place in a variety of ways, in principle. One example thereof is shown in FIG. 2. In this example, no short circuit of the load 50 occurs. The temporal profiles of various signals are illustrated. As can be discerned in subfigure 2(*a*), the logic unit 20 outputs a for example pulse-width-modulated, digital signal S0 having two levels: an on level (here: a high level, identified by "on"), according to which the transistor 30 is intended in principle to be switched on, and an off level (here: a low level, identified by "off"), according to which the transistor 30 is intended in principle to be switched off. The on level and the off level accordingly represent items of setpoint state information according to which the transistor 30 is intended to be switched on and switched off, respectively. The low level, for example a voltage, is lower than the high level. Alternatively, the on level could also be a low level, and the off level a high level. Instead of being embodied as a voltage signal, the signal S0 could for example also be embodied as a current signal having two different current levels and, for example only shortly before or in the drive signal generator 10, could be converted into a voltage signal having two different voltage levels by virtue of the current signal being sent through a resistor. The voltage dropped across the resistor would then correspond to the voltage signal.

In accordance with a further alternative configuration, the signal S0 could also be a coded digital radio-frequency signal, or it could be present in the form of a radio-frequency signal having (exactly or at least) two different frequencies.

The signal S0 then changes from "off" to "on" at points in time t1, t1', t1" etc., and from "on" to "off" at points in time t2, t2', etc. The frequency of the signal S0 is equal to 1/(t1'–t1). The signal S0 indicates at each point in time t whether the transistor 30 is intended in principle to be switched on or off or to remain switched on or off. Accordingly, the signal S0 specifies setpoint switched-on durations Ton=t2–t1 and Ton=t2'–t1', and also setpoint switched-off durations Toff=t1'–t2 and Toff=t1"–t2'. Successive setpoint switched-on durations Ton can be identical or different. Moreover, successive setpoint switched-off durations Toff can be identical or different.

Subfigure 2(*b*) shows the profile of the first short-circuit information signal SC1. The first short-circuit information signal SC1 has two levels: a first level (here: a high level, identified by "yes"), according to which a potential short circuit of the load 50 is present, and a second level (here: a low level, identified by "no"), according to which no short circuit of the load 50 is present. The first level, for example a voltage, is higher than the second level. Alternatively, the first level could also be a low level, and the second level a high level.

The short-circuit information signal SC1 can be based for example on the measurement of the voltage drop across a shunt resistor connected in series with the load path C-E and the load 50. Provided that the transistor 30 is switched on, a current flows through the load 50 and thus through the shunt resistor. With the load 50 functioning properly, it limits the current to a value dependent in particular on the construction of the load 50.

If a short circuit of the load 50 then occurs in the fault situation, the current through the load 50 and through the shunt resistor rises to a value that is higher than a maximum current attained in the fault-free situation. In association with this, in the fault situation, the voltage dropped across the shunt resistor also rises to a value that is higher than a maximum voltage attained in the fault-free situation. Consequently, by monitoring the voltage drop across the shunt resistor, it is possible in principle to identify a fault situation, that is to say a short circuit of the load 50.

As has already been mentioned, an unusually high current through the load path of the transistor 30 (and if appropriate through the shunt resistor) can also occur if capacitances are charged or subjected to charge reversal, to be precise even with a fault-free load 50, i.e. if no short circuit of the load 50 is present. In this case, the voltage dropped across the shunt resistor would likewise attain an unusually high value. Consequently, just from the voltage drop across the shunt resistor it cannot reliably be deduced that a short circuit of the load 50 is actually present. The same correspondingly applies not only if the presence of a short circuit is determined on the basis of a voltage drop across a shunt resistor, but also for many other types of determining a short circuit. In such cases, from the first short-circuit information signal SC1 it can only be inferred that a short circuit of the load 50 is potentially present.

Not only in the present example of a shunt resistor but also in many other methods for determining a potential short circuit of the load 50, a meaningful interpretation of the first short-circuit information signal SC1 is possible only if the transistor 30 has already been switched on in an uninterrupted manner for a certain duration. Specifically, in the example explained and also in many other methods of determining a short circuit, a potential short circuit can be established only if a load current flows through the load path C-E of the transistor 30. If otherwise the transistor 30 is in the blocking state and no load current flows through the load path C-E, the voltage drop across the shunt resistor is equal to zero even if the load 50 has a short circuit, that is to say that with the transistor 30 in the blocking state no statement about whether or not a potential short circuit of the load 50 is present can be derived from the first short-circuit information signal SC1.

Proceeding for example from a point in time at which the gate voltage $V_{GE}$ exceeds the switch-on threshold value Vth, the current through the load path C-E, the load 50 and the shunt resistor begins to rise starting from the exceedance. It is also the case as long as the current still has very low values that no statement about whether or not a potential short circuit of the load 50 is present can be derived from the first short-circuit information signal SC1. It is only after a certain delay time Δt starting from the point in time t1 that the current has become sufficiently established that a statement about whether or not a potential short circuit of the load 50 is present can be derived from the first short-circuit information signal SC1. In principle, that means that a short circuit of the load 50 that is present at the point in time of the exceedance or directly afterward cannot be identified and that there is the risk of the transistor 30 being overloaded.

Therefore, in accordance with one aspect of the invention, the transistor 30 can be switched on by the drive signal generator 10 limiting the drive voltage V10 output for switch-on at least initially (i.e. starting from the point in time t1) to a maximum first switch-on voltage limit value Von1, see subfigure 2(c). This illustration disregards the fact that relative to the point in time t1 (point in time of the switching of the signal S0 from "off" to "on") some time still elapses until the drive voltage V10 proceeding from Voff and correspondingly also the gate voltage $V_{GE}$ attain higher values.

The first switch-on voltage limit value Von1 is chosen such that the transistor 30 has a saturation current (and in association therewith a sufficiently high on resistance) chosen such that the transistor 30 is not damaged or destroyed even if a short circuit of the load 50 is present for a predefined waiting duration Tw. Provided that as the situation progresses it is established that a short circuit of the load 50 is definitely not present, the drive voltage V10 can be increased to values higher than Von1, for example to a value or value range of at least Von2.

If otherwise it is established that a short circuit of the load 50 is actually present, the transistor 30 can be switched off. Here there is a further advantage of a drive voltage V10 initially limited to Von1: in the fault situation (i.e. if an actual short circuit of the load 50 was established), the switching off is effected proceeding from a reduced drive voltage V10≤Von1 both more rapidly and in a manner less hard (less hard means proceeding from a lower current or saturation current of the transistor 30 and thus a lower dI/dt) than in the case of switching off proceeding from a higher drive voltage V10. Induced voltage spikes that occur on account of unavoidable leakage inductances are also reduced as a result.

If, during switching on, as already mentioned, a very high current temporarily occurs on account of capacitances to be charged or to be subjected to charge reversal, it may be that the first short-circuit information signal SC1, after the delay time Δt has elapsed, allows the conclusion to be drawn about the potential presence of a short circuit of the load 50, to be precise even if a short circuit of the load 50 is not actually present. In this case, if the capacitances are charged sufficiently, the current will decrease to an extent such that the first short-circuit information signal SC1 (in conjunction with the fact that the transistor 30 is driven with a drive voltage V10>Vth and must therefore be switched on, apart from a certain delay that may occur until the gate voltage $V_{GE}$ adapts to the drive voltage V10) at a point in time t3 allows the conclusion to be drawn that a short circuit of the load 50 is definitely not present.

Therefore, as a reaction to establishing that the first short-circuit information signal SC1 in a period of time starting from the point in time t1 firstly allows the conclusion to be drawn about the presence of a potential short circuit of the load 50, but then, likewise during said period of time, allows the conclusion to be drawn that a short circuit of the load 50 is definitely not present, the drive signal generator 10 can increase the drive voltage V10 to a value or a value range that is greater than or equal to a second switch-on voltage limit value Von2, wherein the second switch-on voltage limit value Von2 is greater than the first switch-on voltage limit value Von1, see subfigure 2(c). By increasing the drive voltage V10 to higher values, the on resistance of the transistor 30 and in association therewith the electrical losses are reduced. The increase of the drive voltage V10 from values less than or equal to Von1 to values of greater than or equal to Von2 can thus be effected as a reaction to the fact that a potential short circuit of the load 50 initially signaled on the basis of SC1 ceases to apply during the waiting duration Tw. That means that upon switch-on, with the increase of the drive voltage V10 to values of greater than or equal to Von2, it is not necessary to wait until the waiting duration Tw has elapsed.

At the point in time t2 the drive signal generator 10 establishes on the basis of the signal S0 that the transistor 30 is intended to be switched off, and as a reaction thereto switches off the transistor 30 as standard by virtue of said drive signal generator limiting the drive voltage V10 output to the transistor 30 to a maximum value that is less than the switch-on threshold value Vth. What is achieved thereby is that the transistor 30 is in the blocking state starting from the point in time t2 until the drive signal generator 10 establishes at the next switch-on point in time t1' on the basis of the signal S0 that the transistor 30 is intended to be switched on, and switches on the transistor 30 again, as has already been described on the basis of the switch-on at the point in time t1.

As in all configurations of the invention, the drive signal generator 10 can optionally set the drive voltage V10 in the range of t1 to t3 for a minimum duration Δtonmin1 of, for example, 2 μs, e.g. approximately 10 μs, to a constant first value that is greater than the switch-on threshold value Vth, but less than or equal to the maximum first switch-on voltage limit value Von1. Optionally, in this case, Δtonmin1 may correspond to the entire period of time from t1 to t3, such that it holds true that: Δtonmin1=t3−t1.

The same correspondingly also applies to the range from t3 to t2. Here the drive signal generator 10, likewise optionally and likewise in all configurations of the invention, can set the drive voltage V10 for a minimum duration Δtonmin2 of at least 1 μs to a constant second value that is greater than or equal to the second switch-on voltage limit value Von2. Optionally, in this case, Δtonmin2 may correspond to the entire period of time from t3 to t2, such that it holds true that: Δtonmin1=t2−t3.

Subsequently, the transistor 30 in constant alternation as described is switched off as standard as a reaction to the signal changes of the signal S0 from "on" to "off" that occur at the switch-off points in time (t2' etc.), and is switched on as a reaction to the signal changes of the signal S0 from "off" to "on" that occur at the switch-on points in time (t1" etc.), provided that a short circuit of the load 50 does not occur.

If, on the other hand, as explained below with reference to FIG. 3, from the first short-circuit information signal SC1 even with the elapsing of a predefined waiting duration Tw starting from the point in time t1 the potential presence of a short circuit of the load 50 still results, then it is deduced that a short circuit of the load 50 is actually present. In the example in accordance with FIG. 3, a short circuit of the load 50 is already present directly before the transistor 30 is switched on, i.e. directly before the point in time t1.

The switching on of the transistor 30 is effected in the same way as explained with reference to FIG. 2 at the point in time t1, see subfigure 3(*c*). After a delay time Δt has elapsed, the first short-circuit information signal SC1 starting from the point in time t1+Δt permits a meaningful statement with regard to the potential presence of a short circuit. Since the first short-circuit information signal SC1 even with the elapsing of the waiting duration Tw, that is to say at the point in time t4=t1+Tw, still allows the conclusion to be drawn about the potential presence of a short circuit of the load 50, it is assumed that not just a potential but rather an actual short circuit of the load 50 is present. As a reaction thereto, the drive signal generator 10 outputs a drive voltage V10 that is less than the switch-on threshold value Vth, that is to say that the transistor 30 is switched off in a short-circuit-dictated manner. In association therewith, the current through the shunt resistor is also interrupted, and the first short-circuit information signal SC1, which then signals (on account of the absent current) the presence of no short circuit of the load 50, even though a short circuit is present, thus loses its meaningfulness.

Since an actual short circuit of the load 50 was established at the point in time t4, that is to say after the waiting duration Tw had elapsed, the drive signal generator 10 can optionally assume that this short circuit is permanent, and as a reaction thereto can limit the drive voltage V10 output to the transistor 30 to a maximum value that is less than the switch-on threshold value Vth. As a result, the transistor 30 is permanently switched off.

As a reaction to the actual short circuit of the load 50 established at the point in time t4, the transistor 30 is permanently switched off, independently of the information content of the signal S0. The transistor 30 thus remains switched off even if it is apparent from the signal S0 that the transistor 30 should actually be switched on or be in the switched-on state. In principle, however, it is possible to provide further measures which instigate an automatic continuation of normal switching operation under that assumption if it is established that the cause of the short circuit of the load has ceased to apply or has been eliminated. In particular, the driving 10 can also remain permanently switched off for a preset duration after the detection of an actual short circuit and react regularly again to the input signal S0 of the controller 20 after the preset duration has elapsed. A reset by the controller 20 can be effected for example by virtue of the signal S0 remaining switched off for longer than a preset duration.

The waiting duration Tw can be for example constant (e.g. equal or approximately equal to 2 μs, or equal to or approximately equal to 5 μs, or equal to or approximately equal to 10 μs). Likewise, the waiting duration Tw can be at least 2 μs or at least 5 μs or at least 10 μs. In this case, the waiting duration Tw can be constant or alternatively variable.

Provided that the present setpoint switched-on duration Ton is less than or equal to the waiting duration Tw, this has the effect that the transistor 30 is already switched off before or with the elapsing of the waiting duration Tw. In this case, the drive voltage V10 during the relevant switching cycle (the latter consists of the present setpoint switched-on duration Ton and the setpoint switched-off duration Toff directly succeeding the latter) is not increased to a value range of at least Von2, rather it remains restricted to a value range of at most Von1.

Figure 4:
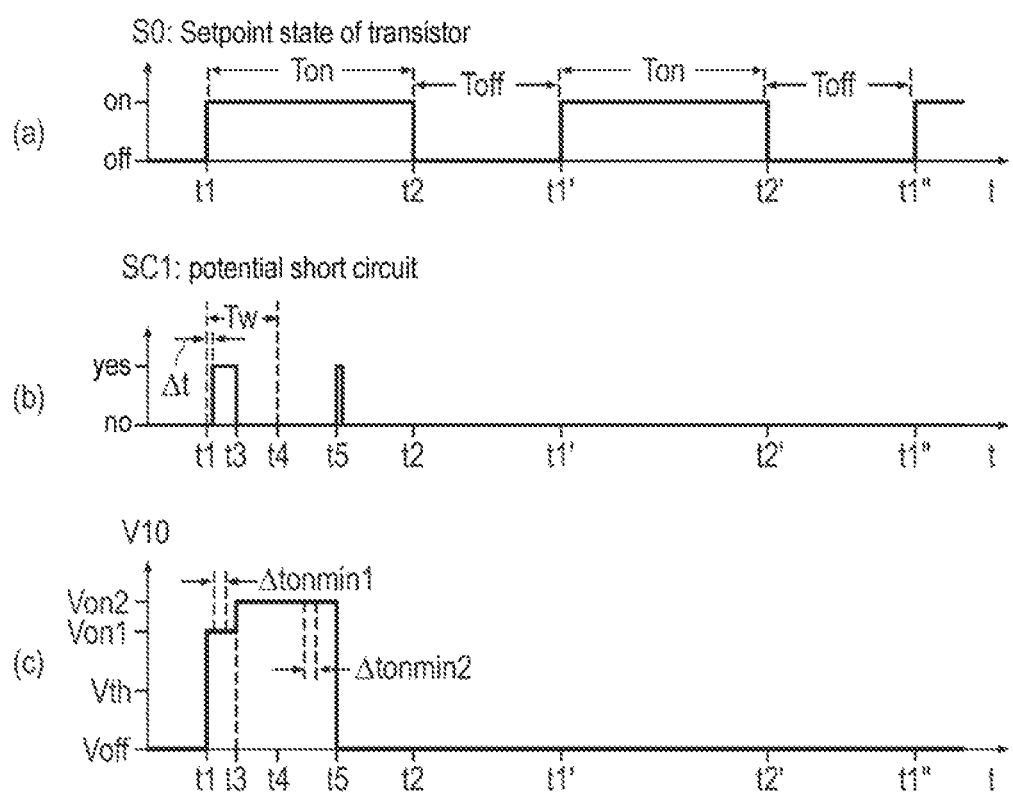

Referring to FIG. 4, a description will now be given of a possible switching behavior for the case where a short circuit of the load 50 occurs with the transistor 30 switched on, but only after the waiting duration Tw has elapsed.

The switching on of the transistor 30 and the further course until the waiting duration Tw has elapsed, that is to say until the point in time t4, are implemented as explained above with reference to FIG. 2. As a reaction to the change of the signal S0 from "off" to "on" at the point in time t1, the transistor 30 is switched on and then remains permanently switched on until a point in time t5 following the point in time t4, to be precise starting from switch-on (i.e. starting from the point in time from which V10 or $V_{GE}$ exceeds the value Vth) until t3, permanently on the basis of a drive voltage V10 having a value or value range of less than or equal to Von1, and in the interval from t3 to t5 permanently on the basis of a drive voltage V10 having a value or value range of more than Von2. The point in time t5 is thus situated between the switch-on point in time t1 and the next planned switch-off point in time t2 following t1, said switch-off point in time being predefined by the signal S0.

At the point in time t5 an actual short circuit of the load 50 then occurs, and the first short-circuit information signal SC1 thus signals a potential short circuit of the load 50. In view of the fact that the first short-circuit information signal SC1, after the waiting duration Tw has elapsed, signals a potential short circuit of the load 50 at a point in time t5 at which the drive signal generator 10 outputs a drive voltage V10 that is greater than the switch-on threshold value Vth, it can be assumed that an actual and permanent short circuit of the load 50 occurred at the point in time t5. As a reaction thereto, the drive signal generator 10 can limit the drive voltage V10 to a maximum value that is less than the switch-on threshold value Vth. As a result, the transistor 30 is permanently switched off in a short-circuit-dictated manner starting from the point in time t5. The transistor 30 thus remains switched off even if it is apparent from the signal S0 that the transistor 30 should actually again be switched on or be in the switched-on state. Owing to the switching off, the current through the shunt resistor is interrupted, such that the first short-circuit information signal SC1 incorrectly signals that no short circuit of the load 50 is present.

Figure 5:
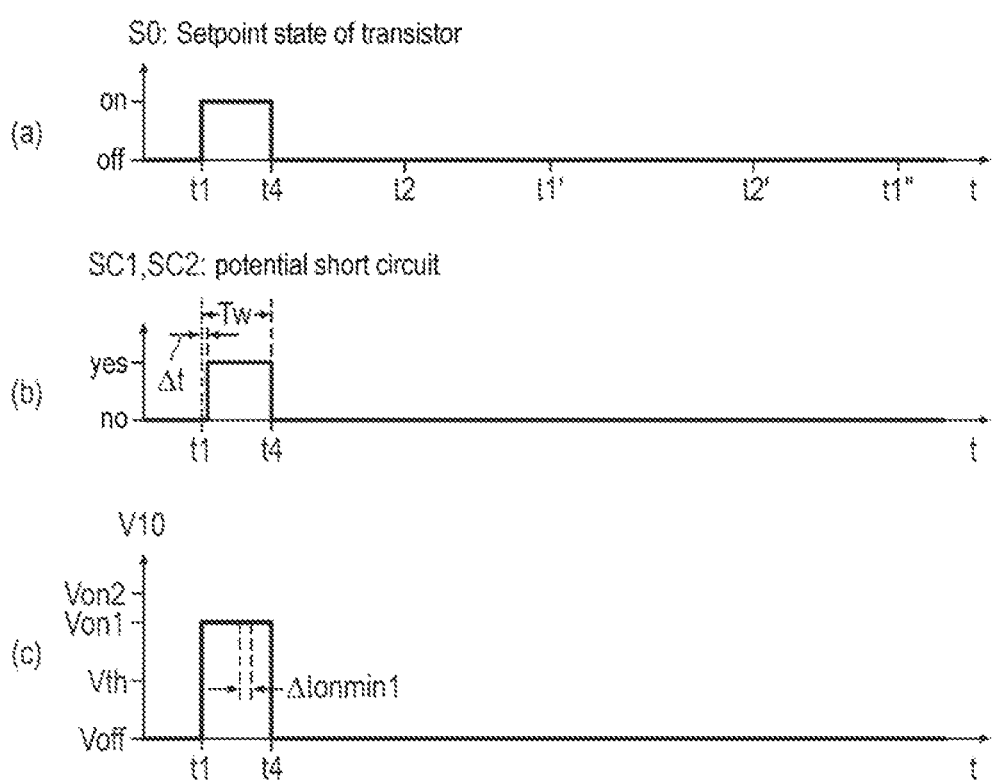
FIG. 5 illustrates the temporal profile of various signals of an arrangement in accordance with FIG. 1, wherein, in accordance with a short-circuit event of a first type, a short circuit of the load is already present when the transistor is switched on, and wherein a short-circuit information signal is fed not only to the drive signal generator but also to the logic unit.
Figure 6:
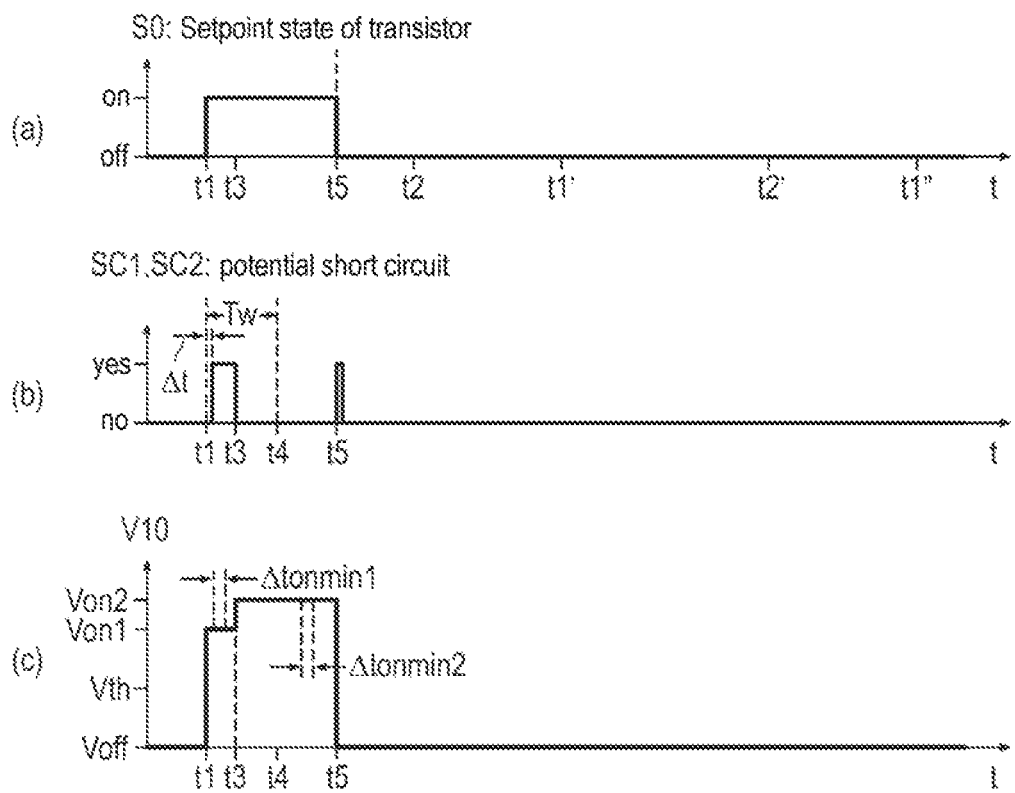
FIG. 6 illustrates the temporal profile of various signals of an arrangement in accordance with FIG. 1, wherein, in accordance with the short-circuit event of a second type, a short circuit of the load occurs only after the transistor has been switched on, and wherein a short-circuit information signal is fed not only to the drive signal generator but also to the logic unit.

In the exemplary embodiments explained with reference to FIGS. 2 to 4, consideration was given only to possible variants in respect of how the circuit may behave on account of the first short-circuit information signal SC1 evaluated by the drive signal generator 10. Referring to FIGS. 5 and 6 it is also explained by way of example below that a short-circuit information signal can optionally also be fed to the logic unit 20. This short-circuit information signal fed to the logic unit 20, as also shown in FIG. 1, is designated below as the second short-circuit information signal SC2. In this case, too, all of the variants explained above can be realized, of course, with the circuit.

Just like the first short-circuit information signal SC1, the second short-circuit information signal SC2 also contains information about whether a potential short circuit of the load 50 is present. The second short-circuit information signal SC2 can be generated on the basis of the same measurement variable or the same measurement variables as the first short-circuit information signal SC1, but also on the basis of one or more other measurement variables.

Insofar as the first short-circuit information signal SC1 and the second short-circuit information signal SC2 are generated on the basis of the same measurement variable or the same measurement variables, they may be identical, but also different, for example have different levels, such that the first short-circuit information signal SC1 complies with the requirements of the drive signal generator 10, and the second short-circuit information signal SC2 complies with the requirements of the logic unit 20.

In the examples in accordance with FIGS. 5 and 6 it is assumed for simplification that the first short-circuit information signal SC1 and the second short-circuit information signal SC2 are identical. Accordingly, SC1 and SC2 are illustrated in each case in a combined manner in subfigures 5(b) and 6(b).

Figure 3:
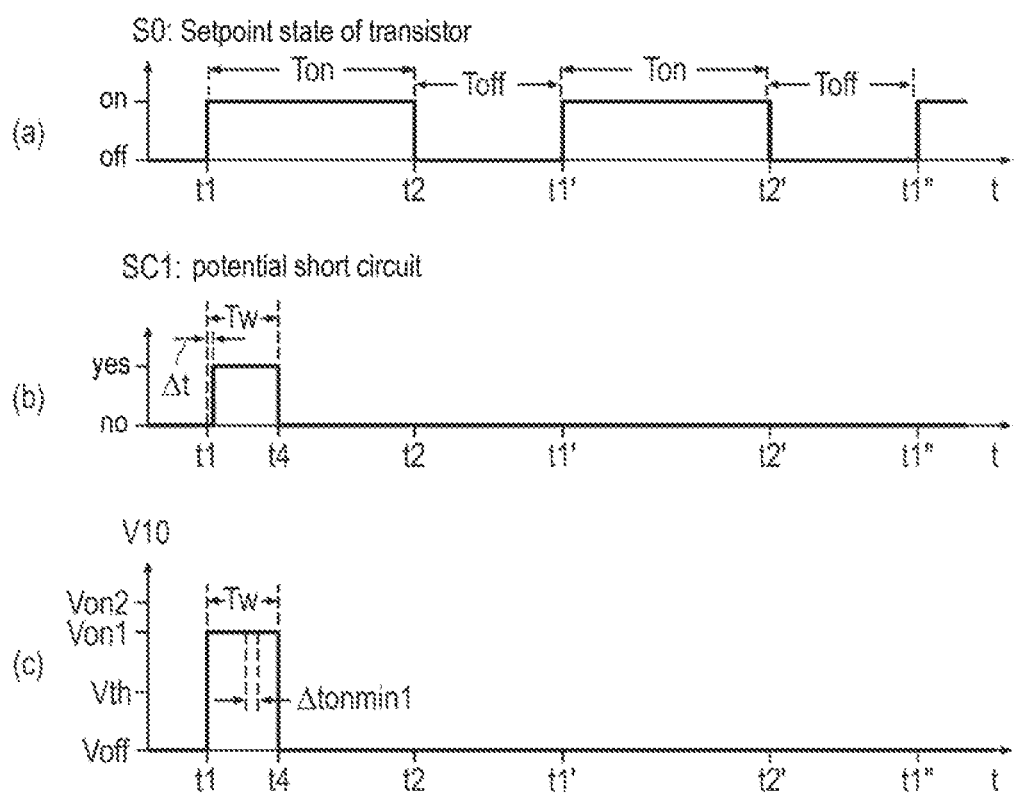

The example in accordance with FIG. 5 corresponds to the example in accordance with FIG. 3 with the sole difference that, as a reaction to the fact that the second short-circuit information signal SC2 once the waiting duration Tw has elapsed at the point in time t4 allows the conclusion to be drawn about the presence of a short circuit of the load 50, the logic unit 20 outputs permanently with the signal S0 information that the transistor 30 is intended to be switched off and then to remain permanently switched off.

The example in accordance with FIG. 6 substantially corresponds to the example in accordance with FIG. 4. The sole difference is that the second short-circuit information signal SC2 after the waiting duration Tw has elapsed at a point in time t5 signals the occurrence of a short circuit of the load 50, with respect to which the signal S0 signals that the transistor 30 is intended to be switched on. As a reaction thereto, the logic unit 20 outputs permanently with the signal S0 information according to which the transistor 30 is intended to be switched off and then to remain permanently switched off.

In subfigures 2(c), 3(c), 4(c), 5(c) and 6(c), insofar as applicable and merely by way of example, the switch-on drive voltage V10 of at most Von1 reduced for protection against destruction of the transistor 30 in the case of a possible short circuit of the load 50 (i.e. in subfigures 2(c), 4(c) and 6(c) in the interval starting from switch-on to t3 and in subfigures 3(c) and 5(c) in the interval starting from switch-on to t4) was always set to be equal to Von1 and, starting from the point in time t3, at which it was established that no short circuit of the load 50 is present, the drive voltage V10 was increased to at least Von2 (i.e. in subfigure 2(c) in the interval starting from establishment at the point in time t3 to t2, and in subfigures 4(c) and 6(c) in the interval starting from the establishment at the point in time t3 to t5) and was always set to be equal to Von2.

Further examples of possible switch-on processes are explained below with reference to FIGS. 7 and 8.

Figure 7:
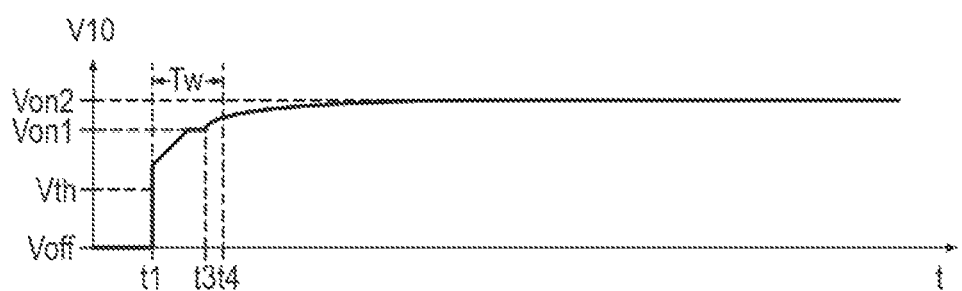

In the example in accordance with FIG. 7, the drive signal generator 10 at the point in time t1 infers from the signal S0 that the transistor 30 is intended to be switched on, and accordingly outputs to the transistor 30 a drive voltage V10 that is high enough to switch on the transistor 30, but is initially restricted to values of at most Von1. Accordingly, the drive voltage V10 rises proceeding from Voff and shortly thereafter attains the switch-on threshold value Vth, at which the transistor 30 switches on. Starting from switch-on at the point in time t1 the drive voltage V10 rises further (e.g. linearly as shown, or alternatively nonlinearly) until the limitation to Von1 intervenes. Starting from the intervention of the limitation to Von1, V10 remains constant until at a point in time t3 it is certain that no short circuit of the load 50 is present. Consequently, starting from the point in time t3 V10 can be increased to values of more than Von1, in particular to values of at least Von2.

Figure 8:
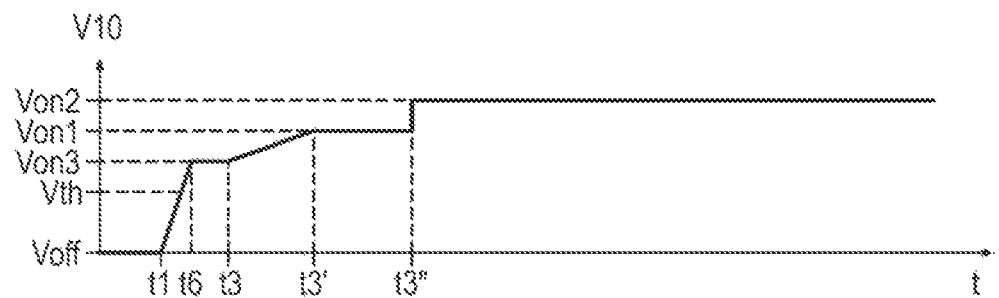

In the example in accordance with FIG. 8, at the point in time t1 the drive signal generator 10 infers from the signal S0 that the transistor 30 is intended to be switched on, and accordingly outputs to the transistor 30 a drive voltage V10 that is high enough to switch on the transistor 30, but is initially restricted to values of at most Von3<Von1. Accordingly, the drive voltage V10 rises proceeding from Voff shortly after the point in time t1 and thereafter attains the switch-on threshold value Vth, at which the transistor 30 switches on. Starting from switch-on the drive voltage V10 rises further (e.g. linearly as shown, or alternatively nonlinearly) until it attains the value Von3 at a point in time t6. Starting from this point in time t6, the limitation of V10 to values of at most Von3 intervenes and is maintained until a point in time t3'. Afterward, V10 is increased further (e.g. linearly or nonlinearly) until the limitation of V10 to Von1 intervenes at a point in time t3". The limitation to Von1 is maintained until at the point in time t3 it is established that a short circuit of the load 50 is not actually present, and, as a reaction thereto, the drive voltage V10 is increased to values of at least Von2. The rise of V10 in the interval from attaining Vth to t3" can take place continuously in order to be able to set the temporal variation of the current I flowing through the load path C-E (that is to say dI/dt) and/or the temporal variation of the voltage Vice dropped across the load path C-E (that is to say dVce/dt). In the time from t1 to t6, a dI/dt setting takes place (i.e. a limitation to a predefined maximum absolute value of the rate of rise of the load current). The same correspondingly also applies to the interval from t6 to t3', wherein a limitation of the rate of rise of the load path voltage $V_{CE}$ to a predefined maximum absolute value is also additionally effected in this interval. A further limitation of the rate of rise of the load path voltage $V_{CE}$ to a predefined maximum absolute value is effected in the interval from t3' to t3". This all applies to normal operation, i.e. in the case free of a short circuit.

In the case of a short circuit, a limitation to a predefined maximum absolute value of the rate of rise of the load current takes place in the entire range from t1 to t3".

For the time intervals evident from the points in time t1, t6, t3', t3" and t3, the following values are suitable, for example:
Duration from t1 to t6: greater than 50 ns.
Duration from t6 to t3': greater than 50 ns.
Duration from t3' to t3": greater than 50 ns.
Duration from t3" to t3: greater than 200 ns, maximum of 10 µs.

Figure 9:
FIG. 9 illustrates a first example of a possible temporal profile of the drive voltage output by the drive signal generator upon switch-off.
Figure 10:
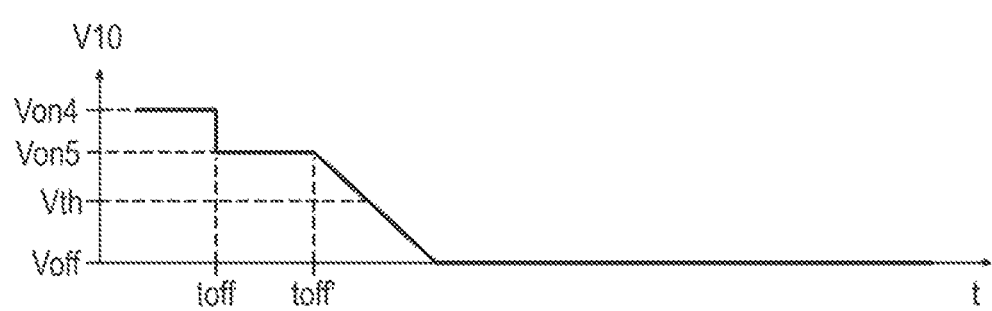
FIG. 10 illustrates a second example of a possible temporal profile of the drive voltage output by the drive signal generator upon switch-off.

Various examples of possible switch-off processes are explained below with reference to FIGS. 9 and 10. This can involve in each case a planned switched-off process, i.e. a switch-off process which takes place as a reaction to the signal S0 changing (in subfigure 2(a) for example at the point in time t2) from "on" to "off", or a short-circuit-dictated, i.e. unscheduled, switch-off process that takes place as a reaction to the fact that an actual short circuit of the load was established at the point in time t4. In FIGS. 9 and 10, the point in time Toff for the case where a planned switch-off process is involved corresponds to the point in time t2 (or t2', t2" etc.), and for the case where a short-circuit-dictated switch-off process is involved it corresponds to the point in time t4.

Directly before the switching off the drive voltage V10 is in each case at a value Von4. In the case of a planned, i.e. not short-circuit-dictated, switching off, Von4 is greater than or equal to the second switch-on voltage limit value Von2, see for example in subfigure 2(c) the points in time t2, t2', t2". In the case of a short-circuit-dictated switching off wherein the short circuit occurs during a planned switch-on interval Ton but only after the associated waiting duration Tw has elapsed, Von4 is likewise greater than or equal to the second switch-on voltage limit value Von2, see for example in subfigures 4(c) and 6(c) in each case the point in time t5. In the case of a short-circuit-dictated switching off wherein the short circuit occurs directly with the elapsing of a waiting duration Tw, Von4 is less than or equal to the first switch-on voltage limit value Von1, see for example in subfigures 3(c) and 5(c) in each case the point in time t4.

In all these cases the drive voltage V10 can be reduced in a stepwise manner in accordance with FIG. 9. By way of example, the drive voltage V10 can be kept constant at a value Von5 for a certain time starting from the point in time Toff, which value, in the cases in which Von4 is greater than or equal to the second switch-on voltage limit value Von2, is less than or equal to the second switch-on voltage limit value Von2 or even less than or equal to the first switch-on voltage limit value Von1. In the cases in which Von4 is less than or equal to the first switch-on voltage limit value Von1, Von5 can be less than Von4, for example less than Von4 by at least 1 V. Afterward, the drive voltage V10 can be reduced to below the switch-on threshold value Vth at a point in time toff' and the transistor 30 can thereby be switched off. As is shown in FIG. 9, the value of the drive voltage V10 can be kept constant at Von5, for example from toff to toff'.

As can be inferred from the otherwise identical example in accordance with FIG. 10, the drive voltage V10 can be kept constant at Von5 from the point in time toff to the point in time toff' and can then be reduced continuously, for example linearly or nonlinearly, to below the switch-on threshold value Vth, such that the transistor 30 switches off.

Figure 11:
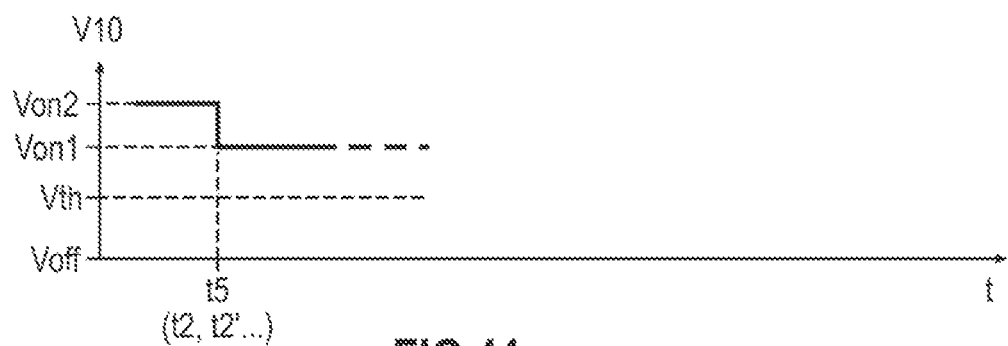
FIG. 11 illustrates a first example in which, with the transistor completely switched on, a short circuit occurs and the transistor is driven with a reduced drive voltage as a reaction thereto.

FIG. 11 shows a variant in which a short circuit of the load 50 occurs while the transistor 30 is completely switched on, i.e. while the drive voltage V10 is greater than or equal to the second switch-on voltage limit value Von2. That corresponds to the profile up to the point in time t5 as explained with reference to FIG. 6. On account of the short circuit, the first short-circuit information signal SC1 and, if provided, also the second short-circuit information signal SC2 signal the presence of a short circuit. As a reaction to the fact that the first short-circuit information signal SC1 signals the occurrence of a short circuit of the load 50, the drive signal generator 10 limits the drive voltage V10 initially to values of less than or equal to the first switch-on voltage limit value Von1 for a specific duration. This ensures that the transistor 30 incurs no damage at least for a duration whose length may correspond at least to the waiting duration Tw, for example. During this duration the control logic 20 can decide whether the transistor 30 is completely switched off in a short-circuit-dictated manner or whether some other measure is taken.

Figure 12:
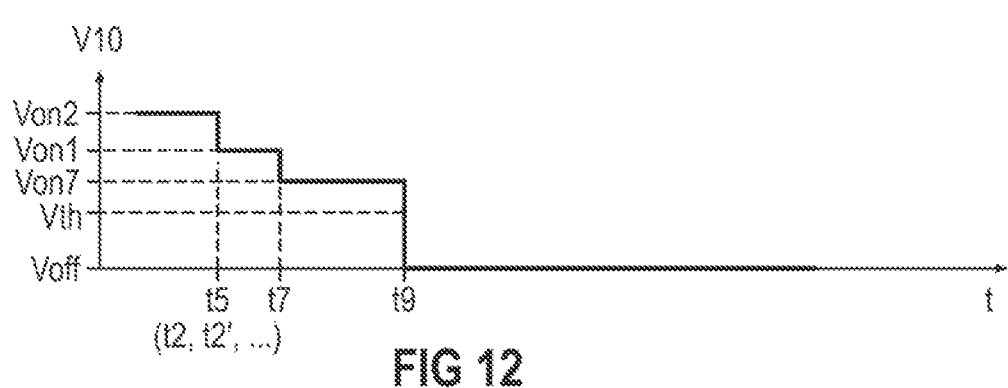
FIG. 12 illustrates a second example in which, with the transistor completely switched on, a short circuit occurs and the transistor is driven with a reduced drive voltage as a reaction thereto.

FIG. 12 shows another variant in which a short circuit of the load 50 occurs at the point in time t5 under the conditions outlined in the case of FIG. 11. As a reaction to the fact that the first short-circuit information signal SC1 signals the occurrence of the short circuit of the load 50, the drive signal generator 10 carries out reduction of its own accord, i.e. not as a reaction to an instruction received by the logic unit to switch off the transistor 30, by virtue of said drive signal generator reducing the drive voltage V10 in a stepwise manner progressively on the basis of at least one, at least two, at least three, etc. levels. By way of example, one step can be at Von1, a directly succeeding step can be at Von7 where Vth<Von7<Von1 etc. until the drive voltage V10 falls below the switch-on threshold voltage Vth of the transistor 30 at a point in time t9. In this case, Von7 can be kept constant for a certain time, for example from t7 to t9. The level of Von7 can be chosen for example such that the load current of the transistor 30 corresponds approximately to half of the current established if the transistor 30 is maximally switched on and the load 50 is short-circuited (i.e. half the short-circuit saturation current).

A shunt resistor connected in series with the load path C-E and the load 50 was explained by way of example above as a device for monitoring a short circuit of the load 50. The device for monitoring a short circuit and thus the generation of a first short-circuit information signal SC1 and, if present, a second short-circuit information signal SC2 can likewise be implemented in a known manner by monitoring the voltage drop Vce across the load path C-E of the transistor 30 (in the case of a transistor 30 embodied as an IGBT, the monitoring of the desaturation voltage; if the voltage drop Vce for a specific drive voltage V10 is higher than expected, this may be indicative of a short circuit of the transistor 30 or, which is likewise known, by virtue of the fact that the gate voltage $V_{GE}$.

The switch-off processes explained with reference to FIGS. 11 and 12 can also be switch-off processes in which the transistor is switched off as planned, i.e. switch-off processes that take place as a reaction to the fact that the signal S0 (in subfigure 2(a) for example at the point in time t2) changes from "on" to "off". For these cases, in FIGS. 11 and 12, the points in time t5 should be replaced by t2, t2', etc. within the meaning of FIGS. 2, 3 and 4.

In all variants of the invention, one or more of the following criteria can be fulfilled individually or in arbitrary combinations with one another:

Criterion 1: The first switch-on voltage limit value Von1 can be less than or equal to 15 V.

Criterion 2: The second switch-on voltage limit value Von2 can be greater than the first switch-on voltage limit value Von1 by at least 1 V.

Criterion 3: The first switch-on voltage limit value Von1 can be greater than the switch-on threshold value Vth by at least 4 V.

Criterion 4: The waiting duration Tw can be at least 2 μs or at least 5 μs or at least 10 μs, and/or it can be less than or equal to 10 μs.

Criterion 5: The first switch-on voltage limit value Von1 can be 15 V, for example, for reasons of compatibility with conventional, short-circuit-proof transistors. However, higher or lower values deviating therefrom for example 12 V, are likewise possible.

Criterion 6: The second switch-on voltage limit value Von2 can be 17 V or 20 V, for example, for reasons of compatibility with conventional, short-circuit-proof transistors. However, higher or lower values deviating therefrom, for example 15 V, are likewise possible as long as it holds true that the second switch-on voltage limit value Von2 is greater than the first switch-on voltage limit value Von1, and as long as the first switch-on voltage limit value Von1 is greater than the switch-on threshold value Vth.

Criterion 7: Any standard switching off—i.e. switching off as planned as a reaction to the signal S0—of the transistor 30 (points in time t2, t2', t2" in subfigure 2(a)) can be effected in exactly or at least one step, namely by the drive voltage V10 being reduced proceeding from the second switch-on voltage limit value Von2 to a switch-off voltage value Voff less than the switch-on threshold value Vth, or in exactly or at least two steps by the drive voltage V10 being reduced proceeding from the second switch-on voltage limit value Von2, firstly in a first step, to a constant value of the first switch-on voltage limit value Von1 and subsequently, in a second step, to a constant value of a switch-off voltage value Voff of less than the switch-on threshold value Vth.

Criterion 8: Any short-circuit-dictated switching off of the transistor 30 wherein a short circuit of the load 50 is determined at a point in time t5 that falls within a setpoint switched-on interval Ton with the signal S0, but follows, with a temporal gap, a waiting duration Tw associated with said setpoint switched-on interval Ton can be effected in exactly or at least one step, in exactly or at least two steps, or in exactly or at least three steps. In the case of exactly or at least one step by the drive voltage V10 being reduced proceeding from the second switch-on voltage limit value Von2 to a switch-off voltage value Voff less than the switch-on threshold value Vth, in the case of exactly or at least two steps by the drive voltage V10 being reduced proceeding from the second switch-on voltage limit value Von2, firstly in a first step, to a constant value of the first switch-on voltage limit value Von1 and subsequently, in a second step, to a constant value of a switch-off voltage value Voff less than the switch-on threshold value Vth, and in the case of exactly or at least three steps by the drive voltage V10 being reduced proceeding from the second switch-on voltage limit value Von2, firstly in a first step, to a constant value of the first switch-on voltage limit value Von1, then being reduced in a second step to a constant value of a further switch-on voltage value, which is less than the first switch-on voltage limit value Von1 but greater than the switch-on threshold value Vth, and then being reduced in a third step to a constant value of a switch-off voltage value Voff less than the switch-on threshold value Vth.

Criterion 9: Provided that the drive voltage V10, as a reaction to establishing that a short circuit of the load 50 is not actually present, is increased from a value or a value range less than or equal to the first switch-on voltage limit value Von1 to a value or value range greater or equal to the second switch-on voltage limit value Von2, the increase can be effected continuously, for example with a predefined edge steepness, or in one, two or arbitrarily more discrete steps.

Criterion 10: The transistor 30, as shown above, can be embodied as an IGBT (Insulated Gate Bipolar Transistor). Equally, however, the transistor 30 can also be some other transistor, for example a MOSFET (Metal Oxide Semiconductor Field Effect Transistor), an HEMT (High Electron Mobility Transistor) or some other transistor.

By virtue of the fact that, in the present invention, the first short-circuit information signal SC1 is fed to the drive signal generator 10 not via the logic unit 20 but rather quasi directly, the drive signal generator 10 can react very rapidly to the occurrence of a short circuit of the load 50.

Moreover, the possibility is afforded of driving the transistor 30 with at least three voltage levels in each case for a certain duration with a constant value of the drive voltage V10: a high switch-on value (e.g. Von2), which is greater than the switch-on threshold value Vth of the transistor 30 and at which the transistor 30 is switched on with a very low first resistance of the load path C-E, a low switch-on value (e.g. Von1), which is greater than the switch-on threshold value Vth of the transistor 30 but less than the high switch-on value and at which the transistor 30 is switched on with an increased second resistance of the load path C-E, which is higher than the first resistance, and a switch-off value (e.g. Voff), which is less than the switch-on threshold value Vth.

The low switch-on value (and in association therewith the second resistance) is coordinated with the waiting duration Tw such that the current through the load path C-E of the transistor 30 is limited in such a way that the transistor 30 is not damaged or destroyed even if the load 50 is short-circuited during the entire waiting duration Tw.

A further advantage is that in phases in which the first short-circuit information signal SC1 and, if appropriate, also the second short-circuit information signal SC2 signal a potential short circuit of the load 50 without a short circuit of the load 50 actually being present, a protective switching off of the transistor 30 and in association therewith an operating disturbance of the entire circuit (e.g. of the inverter, of the switch mode power supply, etc.) of which the transistor 30 is part do not occur. Instead, in these phases, rather than a switching off of the transistor 30, only the efficiency thereof is reduced until it is established whether a short circuit of the load 50 is actually present. If a short circuit of the load 50 is actually present, a short-circuit-dictated protective switching off of the transistor 30 is effected. If otherwise it emerges that a short circuit of the load 50 is not present, the drive voltage V10 of the transistor 30 can be increased in order to increase the efficiency of the transistor 30.

The drive circuit 100 can be realized arbitrarily in principle. In particular, it is possible to accommodate the logic unit 20 and the drive signal generator 10 jointly in one semiconductor chip, or in each case in a dedicated semiconductor chip.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for driving a transistor comprising a drive terminal and a load path by a drive circuit comprising a logic unit and a drive signal generator, wherein the drive signal generator is designed to output a temporally variable drive voltage with which the transistor is driven, the method comprising:
   receiving at the drive signal generator from the logic unit setpoint state information according to which the transistor is intended in principle to be switched on or to remain switched on, or according to which the transistor is intended in principle to be switched off or to remain switched off;
   feeding a first short-circuit information signal of a short-circuit monitoring unit to the drive signal generator, the first short-circuit information signal containing information about the potential presence of a short circuit of an electrical load connected in series with the load path;
   switching on the transistor via the drive signal generator, responsive to the setpoint state information, at a first point in time by setting the drive voltage of the transistor to a value or a value range above a switch-on threshold value of the transistor, and limiting the drive voltage to a maximum first switch-on voltage limit value;
   deciding, by the drive signal generator, depending on the first short-circuit information signal, whether the limiting of the drive voltage is maintained to maximally the first switch-on voltage limit value or whether the drive voltage is set to a value or a value range greater than or equal to a second switch-on voltage limit value which is greater than the first switch-on voltage limit value;
   setting, by the drive signal generator, the drive voltage to the value or the value range greater than or equal to the second switch-on voltage limit value responsive to the first short-circuit information signal directly after a waiting duration has elapsed or during the waiting duration;
   feeding a second short-circuit information signal to the logic unit, the second short-circuit information signal containing information about a possible short circuit of the load;
   outputting, via the logic unit, short-circuit-dictated switch-off information to the drive signal generator responsive to the second short-circuit information signal, after the waiting duration has elapsed but before the setpoint switched-on duration has elapsed, so as to indicate a possible short circuit of the load; and
   leaving, via the drive signal generator, the transistor permanently switched off responsive to the short-circuit-dictated switch-off information.

2. The method of claim 1, wherein the transistor, starting from switch-on until at least the waiting duration has elapsed, remains switched on in an uninterrupted manner by the drive voltage being maintained above the switch-on threshold value in an uninterrupted manner starting from switch-on until at least the waiting duration has elapsed.

3. The method of claim 1, wherein the waiting duration is at least 2 µs.

4. The method of claim 1, wherein the waiting duration is less than or equal to 10 µs.

5. The method of claim 1, wherein the waiting duration begins to proceed starting from the first point in time.

6. The method of claim 1, wherein the transistor remains switched on during the waiting duration even if the first short-circuit information signal indicates a potential short circuit of the load, by the drive signal generator setting the drive voltage fed to the transistor to a value or a value range above the switch-on threshold value.

7. The method of claim 1, wherein:
   the logic unit, for a predefined setpoint switched-on duration greater than the waiting duration, outputs as setpoint state information in an uninterrupted manner switch-on information according to which the transistor is intended to remain switched on; and
   the drive signal generator switches on the transistor responsive to the switch-on information at the first point in time, so that the transistor remains switched on during the entire predefined setpoint switched-on duration, and switches off after the predefined setpoint switched-on duration has elapsed, so long as the first short-circuit information signal in the time period after the waiting duration has elapsed until the setpoint switched-on duration has elapsed does not indicate a short circuit of a load connected in series with the load path.

8. The method of claim 7, wherein the short-circuit-dictated switching off of the transistor and/or the standard switching off of the transistor are effected by the drive signal generator setting the temporally variable drive voltage for a certain duration to a constant value that is equal to the first switch-on voltage limit value.

9. The method of claim 7, wherein the short-circuit-dictated switching off of the transistor and/or the standard switching off of the transistor are effected by the drive signal generator setting the temporally variable drive voltage for a certain duration to a further constant value which produces half or approximately half the short-circuit saturation current.

10. The method of claim 1, further comprising:
    outputting, via the logic unit, the short-circuit-dictated switch-off information to the drive signal generator responsive to the second short-circuit information signal, directly after the waiting duration has elapsed, so as to indicate a possible short circuit of the load.

11. The method of claim 1, wherein the first short-circuit information signal and the second short-circuit information signal are identical.

12. The method of claim 1, further comprising:
    switching off, via the drive signal generator, the transistor in a short-circuit-dictated manner responsive to the first short-circuit information signal, directly after the waiting duration has elapsed, so as to indicate a possible short circuit of the load.

13. The method of claim 1, wherein the first switch-on voltage limit value is less than or equal to 15 V.

14. The method of claim 1, wherein the second switch-on voltage limit value is greater than the first switch-on voltage limit value by at least 1 V.

15. The method of claim 1, wherein the first switch-on voltage limit value is greater than the switch-on threshold value by at least 4 V.

16. The method of claim 1, wherein if the drive signal generator switches on the transistor at the first point in time, the drive signal generator sets the drive voltage for a duration of at least 1 μs to a constant value that is greater than the switch-on threshold value but less than or equal to the maximum first switch-on voltage limit value.

17. The method of claim 1, wherein if the drive signal generator sets the drive voltage of the transistor to a value or a value range greater than or equal to the second switch-on voltage limit value, also sets the drive voltage for a duration of at least 1 μs to a constant value that is greater than or equal to the second switch-on voltage limit value.

18. A drive circuit for driving a transistor having a drive terminal and a load path, the drive circuit comprising:
- a drive circuit comprising a logic unit and a drive signal generator,
- wherein the drive signal generator is configured to output a variable drive voltage for driving the transistor,
- wherein the logic unit is configured to output setpoint state information according to which the transistor is intended in principle to be switched on or to remain switched on or according to which the transistor is intended in principle to be switched off or to remain switched off,
- wherein the drive circuit is configured to feed the setpoint state information to the drive signal generator,
- wherein the drive signal generator comprises an input via for receiving a first short-circuit information signal,
- wherein the drive signal generator is configured to switch on the transistor responsive to setpoint state information at a first point in time, by setting a drive voltage of the transistor to a value or a value range above a switch-on threshold value, but limiting the drive voltage to a maximum first switch-on voltage limit value,
- wherein the drive signal generator is configured to receive a first short-circuit information signal and, depending on the first short-circuit information signal, to decide whether the drive voltage is maintained maximally at the first switch-on voltage limit value or whether the drive voltage is set to a value or a value range greater than or equal to a second switch-on voltage limit value, which is greater than the first switch-on voltage limit value,
- wherein the drive signal generator is configured to set the drive voltage to the value or the value range greater than or equal to the second switch-on voltage limit value responsive to the first short-circuit information signal directly after a waiting duration has elapsed or during the waiting duration,
- wherein the logic unit is configured to receive a second short-circuit information signal, the second short-circuit information signal containing information about a possible short circuit of the load,
- wherein the logic unit is configured to output short-circuit-dictated switch-off information to the drive signal generator responsive to the second short-circuit information signal, after the waiting duration has elapsed but before the setpoint switched-on duration has elapsed, so as to indicate a possible short circuit of the load,
- wherein the drive signal generator is configured to leave the transistor permanently switched off responsive to the short-circuit-dictated switch-off information.

19. A method for driving a transistor comprising a drive terminal and a load path by a drive circuit comprising a logic unit and a drive signal generator, wherein the drive signal generator is designed to output a temporally variable drive voltage with which the transistor is driven, the method comprising:
- receiving at the drive signal generator from the logic unit setpoint state information according to which the transistor is intended in principle to be switched on or to remain switched on, or according to which the transistor is intended in principle to be switched off or to remain switched off;
- feeding a first short-circuit information signal of a short-circuit monitoring unit to the drive signal generator, the first short-circuit information signal containing information about the potential presence of a short circuit of an electrical load connected in series with the load path;
- switching on the transistor via the drive signal generator, responsive to the setpoint state information, at a first point in time by setting the drive voltage of the transistor to a value or a value range above a switch-on threshold value of the transistor, and limiting the drive voltage to a maximum first switch-on voltage limit value,
- deciding, by the drive signal generator, depending on the first short-circuit information signal, whether the limiting of the drive voltage is maintained to maximally the first switch-on voltage limit value or whether the drive voltage is set to a value or a value range greater than or equal to a second switch-on voltage limit value which is greater than the first switch-on voltage limit value;
- setting, by the drive signal generator, the drive voltage to the value or the value range greater than or equal to the second switch-on voltage limit value responsive to the first short-circuit information signal directly after a waiting duration has elapsed or during the waiting duration;
- for a predefined setpoint switched-on duration greater than the waiting duration, outputting, by the logic unit, as setpoint state information in an uninterrupted manner switch-on information according to which the transistor is intended to remain switched on; and
- switching on, by the drive signal generator, the transistor responsive to the switch-on information at the first point in time, so that the transistor remains switched on during the entire predefined setpoint switched-on duration, and switches off after the predefined setpoint switched-on duration has elapsed, so long as the first short-circuit information signal in the time period after the waiting duration has elapsed until the setpoint switched-on duration has elapsed does not indicate a short circuit of a load connected in series with the load path; and
- setting, by the drive signal generator, the temporally variable drive voltage for a certain duration to a further constant value which produces half or approximately half the short-circuit saturation current, to effect the short-circuit-dictated switching off of the transistor and/or the standard switching off of the transistor.

* * * * *

UNITED STATES PATENT AND TRADEMARK OFFICE
CERTIFICATE OF CORRECTION

PATENT NO. : 10,075,158 B2
APPLICATION NO. : 15/248906
DATED : September 11, 2018
INVENTOR(S) : R. Bayerer et al.

Page 1 of 1

It is certified that error appears in the above-identified patent and that said Letters Patent is hereby corrected as shown below:

In the Claims

Column 20, Line 6 (Claim 4, Line 2), please change "ps." to -- µs. --.

Signed and Sealed this
Thirteenth Day of November, 2018

Andrei Iancu
*Director of the United States Patent and Trademark Office*